(12) United States Patent
Yamasaki et al.

(10) Patent No.: US 9,520,317 B2
(45) Date of Patent: Dec. 13, 2016

(54) CHIP SUPPLYING APPARATUS

(71) Applicant: FUJI MACHINE MFG. CO., LTD., Chiryu (JP)

(72) Inventors: Toshihiko Yamasaki, Nisshin (JP); Toshinori Shimizu, Kariya (JP); Hiroyasu Ohashi, Toyota (JP); Masaki Murai, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/441,305

(22) PCT Filed: Nov. 7, 2012

(86) PCT No.: PCT/JP2012/078873
§ 371 (c)(1),
(2) Date: May 7, 2015

(87) PCT Pub. No.: WO2014/073057
PCT Pub. Date: May 15, 2014

(65) Prior Publication Data
US 2015/0287627 A1 Oct. 8, 2015

(51) Int. Cl.
*H01L 21/687* (2006.01)
*H01L 21/67* (2006.01)
(Continued)

(52) U.S. Cl.
CPC ...... *H01L 21/68785* (2013.01); *B25J 11/0095* (2013.01); *B25J 15/0028* (2013.01);
(Continued)

(58) Field of Classification Search
CPC .................. H01L 21/68785; H01L 21/68721; H01L 21/68728; H01L 21/68707; H01L 21/68714; H01L 21/67144; H01L 21/67346; B25J 11/0095; B25J 15/0028
(Continued)

(56) References Cited

U.S. PATENT DOCUMENTS 5,046,909 A * 9/1991 Murdoch .......... H01L 21/68707
294/113
5,797,317 A * 8/1998 Lahat ...................... G03F 7/707
101/127.1
(Continued)

FOREIGN PATENT DOCUMENTS

JP 2010 268015 11/2010

OTHER PUBLICATIONS

International Search Report Issued Feb. 19, 2013 in PCT/JP12/078873 filed Nov. 7, 2012.

*Primary Examiner* — Dean Kramer
(74) *Attorney, Agent, or Firm* — Oblon, McClelland, Maier & Neustadt, L.L.P.

(57) ABSTRACT

A chip supplying apparatus supplies a chip to a mounting machine which mounts the chip on a substrate is disclosed. The chip supplying apparatus includes wafer table which holds a wafer sheet at a position where an operation head of the mounting machine can receive the chip. In the chip supplying apparatus, the wafer table is provided with a frame, a stopper which is fixed to the center of a front portion of the frame and abuts against a front end of the wafer sheet, and a pair of clamp mechanisms which is supported by the frame and which clamps both side ends of the wafer sheet. In the chip supplying apparatus, a position of the pair of clamp mechanisms in a right-and-left direction with respect to the frame can be changed in multiple steps.

6 Claims, 8 Drawing Sheets

(51) Int. Cl.
*H01L 21/673* (2006.01)
*B25J 11/00* (2006.01)
*B25J 15/00* (2006.01)

(52) U.S. Cl.
CPC .. *H01L 21/67144* (2013.01); *H01L 21/67346* (2013.01); *H01L 21/68707* (2013.01); *H01L 21/68721* (2013.01); *H01L 21/68728* (2013.01)

(58) Field of Classification Search
USPC .................................. 294/119.1; 414/225.01
See application file for complete search history.

(56) References Cited

U.S. PATENT DOCUMENTS

| | | | | |
|---|---|---|---|---|
| 6,986,636 | B2* | 1/2006 | Konig | H01L 21/68 414/754 |
| 8,567,837 | B2* | 10/2013 | Chang | B65G 47/90 294/119.1 |
| 2009/0161238 | A1* | 6/2009 | Kosmowski | B23K 26/046 359/823 |
| 2010/0078865 | A1* | 4/2010 | Pan | H01L 21/68728 269/61 |

* cited by examiner

CHIP SUPPLYING APPARATUS

TECHNICAL FIELD

The present disclosure relates to a chip supplying apparatus which supplies a chip to a mounting machine which mounts the chip on a substrate.

BACKGROUND ART

JP-A-2010-268015 discloses a chip supplying apparatus which supplies a chip to a mounting machine which mounts the chip on a substrate. The chip supplying apparatus is provided with a wafer table which holds a wafer sheet at a position where an operation head of the mounting machine can receive the chip. In addition, the wafer sheet which is referred in this specification means a sheet which is made by installing a dicing sheet to which a wafer diced in a desired chip shape is adhered on a wafer holding board having an opening at the center thereof.

BRIEF SUMMARY

Technical Problem

In a chip supplying apparatus, there is a case where a user desires to supply a chip from wafers having different sizes from each other. In a chip supplying apparatus in the related art, even when the sizes of the wafers are different from each other, by setting outer shapes of all of wafer holding boards to be the same tray shape, it is possible to hold wafer sheets by the same wafer table. In the chip supplying apparatus in the related art, when the outer shapes of the wafer holding boards are different from each other, and thus, when the sizes of the wafer sheets are different from each other, it is not possible to hold the wafer sheets by the same wafer table. A technology, in which the wafer sheets can be held by the same wafer table even when the sizes of the wafer sheets are different from each other, is expected.

Solution to Problem

In this specification, a chip supplying apparatus which supplies a chip to a mounting machine which mounts the chip on a substrate is disclosed. The chip supplying apparatus is provided with a wafer table which holds a wafer sheet at a position where an operation head of the mounting machine can receive the chip. In the chip supplying apparatus, the wafer table is provided with a frame, a stopper which is fixed to the center of a front portion of the frame and abuts against a front end of the wafer sheet, and a pair of clamp mechanisms which is supported by the frame and which clamps both side ends of the wafer sheet. In the chip supplying apparatus, a position of the pair of clamp mechanisms in a right-and-left direction with respect to the frame can be changed in multiple steps.

In the above-described chip supplying apparatus, as the front end of the wafer sheet abuts against the stopper and both side ends of the wafer sheet are clamped by the pair of clamp mechanisms, the wafer sheet is held being positioned in a front-and-back direction and in a right-and-left direction with respect to the wafer table. In the above-described chip supplying apparatus, by changing the position of the pair of the clamp mechanisms in the right-and-left direction with respect to the frame, it is possible to hold the wafer sheets having different sizes from each other by the same wafer table.

DETAILED DESCRIPTION

Figure 1:
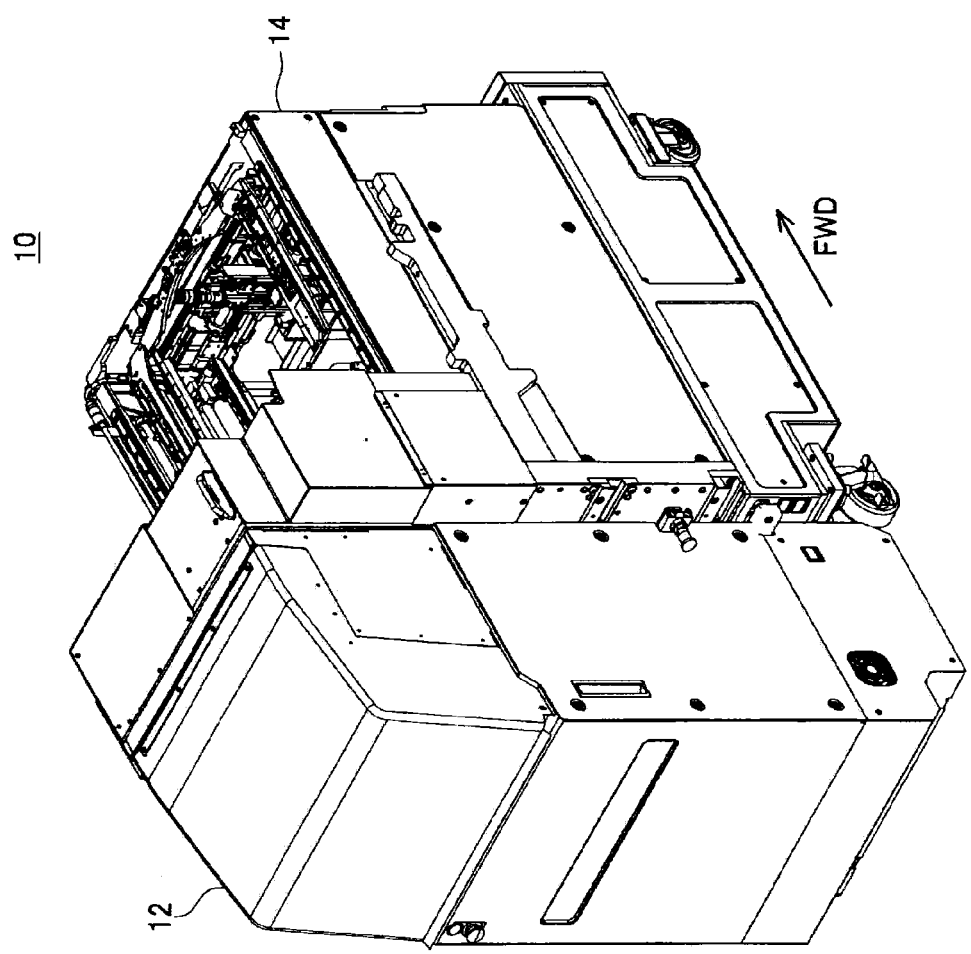
FIG. 1 is a view illustrating an external appearance of a chip supplying apparatus 10.

The above-described chip supplying apparatus can be configured so that a frame is provided with a front frame plate, a rear frame plate, and a side frame plate, a clamp mechanism is supported by the front frame plate and the rear frame plate, a front engaging portion is formed in the vicinity of a front end of the clamp mechanism, a rear engaging portion is formed in the vicinity of a rear end of the clamp mechanism, a plurality of front engaged portions which can be engaged with the front engaging portion are formed on the front frame plate, and a plurality of rear engaged portions that can be engaged with the rear engaging portion are formed on the rear frame plate at a position corresponding to a position of the front engaged portion.

According to the above-described chip supplying apparatus, by a simple configuration, it is possible to change the position of a pair of clamp mechanisms in a right-and-left direction with respect to the frame in multiple stages.

The above-described chip supplying apparatus can be configured so that the clamp mechanism is provided with a main plate, a front block which abuts against a rear surface of the front frame plate, a rear block which abuts against a front surface of the rear frame plate, and an intermediate block which is disposed between the front block and the rear block and is fixed to the main plate, one of the front block and the rear block is supported to be slidable in a front-and-back direction with respect to the main plate, and is connected to the intermediate block via an elastic body, the other one of the front block and the rear block is fixed to the main plate, and engagement between the front engaging portion and the front engaged portion is released and an engagement between the rear engaging portion and the rear engaged portion is released by moving the main plate with respect to the frame in a direction in which the elastic body is compressed.

In the above-described chip supplying apparatus, as an operator grasps the main plate and moves the main plate with respect to the frame in the direction in which the elastic body is compressed, the engagement between the front engaging portion and the front engaged portion is released, and the engagement between the rear engaging portion and the rear engaged portion is released. In this state, as the operator moves the main plate in the right-and-left direction with respect to the frame, it is possible to lock the clamp mechanism at a different position. Without using a tool, with a simple operation, it is possible to change the size of a wafer table.

The above-described chip supplying apparatus can be configured so that a rattling preventative plate which is supported by the frame via the elastic body is provided in at least one of the front engaged portion and the rear engaged portion.

According to the above-described chip supplying apparatus, it is possible to prevent rattling between an engaging portion and an engaged portion at a location where the rattling preventative plate is provided.

The above-described chip supplying apparatus can be configured so that an identification mark is provided on an upper surface of the main plate.

According to the above-described chip supplying apparatus, by imaging the identification mark by using a camera for imaging a wafer sheet and by detecting a position thereof by image processing, it is possible to recognize the position of the clamp mechanism in the right-and-left direction with respect to the frame.

Embodiment

A chip supplying apparatus 10 illustrated in FIG. 1 supplies a chip to a mounting machine. The mounting machine mounts the chip which is supplied from the chip supplying apparatus 10 on a substrate which is conveyed in from a production device on an upstream side, and conveys out the substrate on which the chip is mounted to a production device on a downstream side. The chip supplying apparatus 10 is provided with a magazine accommodation portion 12 and a wafer conveyance section 14. In addition, hereinafter, in a state where the chip supplying apparatus 10 is set to the mounting machine, a direction in which the mounting machine is positioned when viewed from the chip supplying apparatus 10 is referred to as a front direction, and an opposite direction thereof is a rear direction. In addition, hereinafter, a right-and-left direction and an up-and-down direction mean a right-and-left direction and an up-and-down direction in a case where a direction in which the mounting machine is positioned is considered as a front direction when viewed from the chip supplying apparatus 10.

Figure 2:
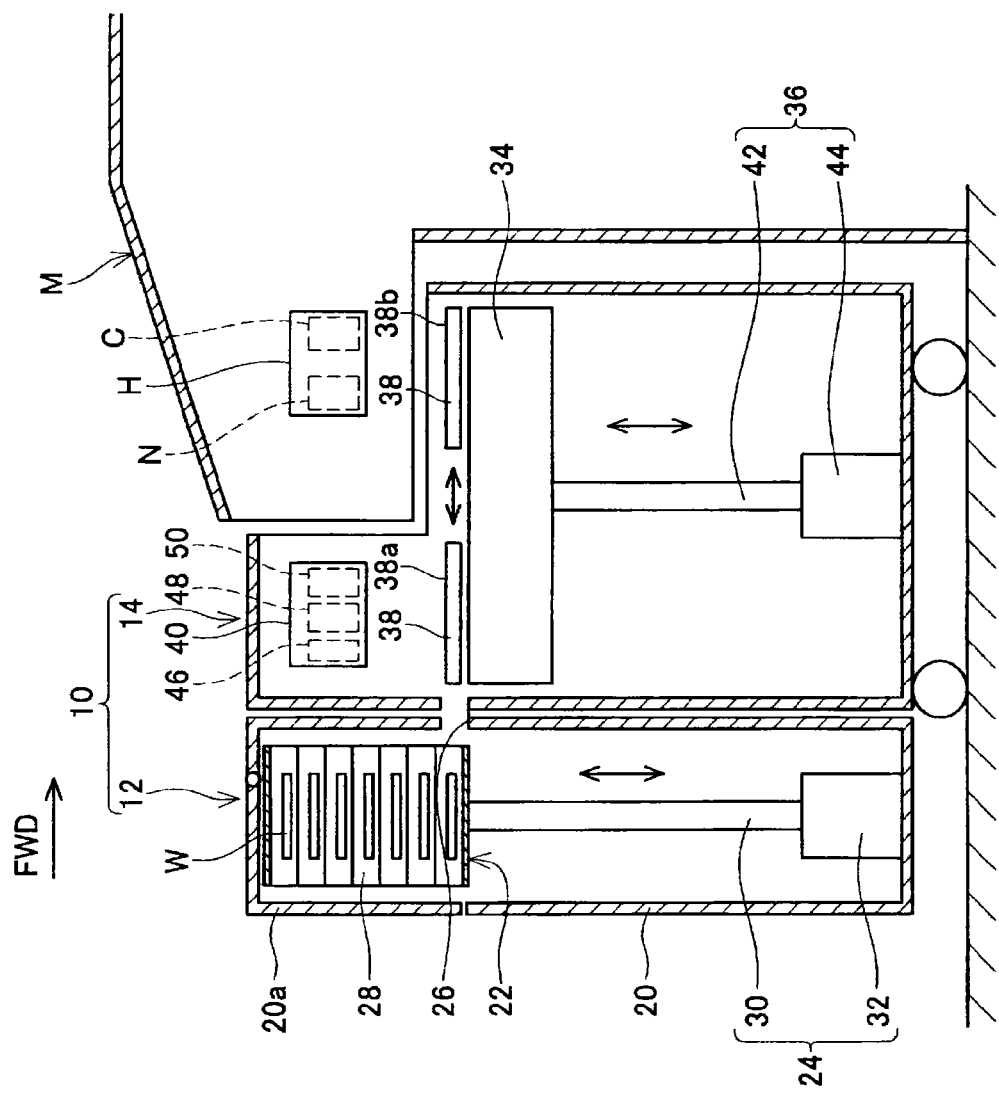
FIG. 2 is a cross-sectional view when a state where the chip supplying apparatus 10 is set to a mounting machine M is viewed from a side.

FIG. 2 illustrates a state where the chip supplying apparatus 10 is set to a mounting machine M. As illustrated in FIG. 2, in a state where the chip supplying apparatus 10 is set to the mounting machine M, a part in front of the wafer conveyance section 14 is disposed inside the mounting machine M.

The magazine accommodation portion 12 of the chip supplying apparatus 10 is provided with a housing 20, a magazine 22, and a magazine ascending/descending mechanism 24.

The housing 20 accommodates the magazine 22 and the magazine ascending/descending mechanism 24. On a front surface of the housing 20, a conveying-out port 26 which conveys out a wafer sheet W accommodated in the magazine 22 is formed. The wafer sheet W in the embodiment is referred to as a sheet which is made by installing a dicing sheet to which a wafer diced in a desired chip shape is adhered on a wafer holding board having a substantially circular opening at the center thereof. In addition, on a rear surface of the housing 20, an opening/closing lid 20a which is opened and closed by the operator is formed.

The magazine 22 is provided with a plurality of wafer sheet accommodation portions 28 which accommodate the wafer sheet W. The plurality of wafer sheet accommodation portions 28 are layered in a height direction. In each wafer sheet accommodation portion 28, the wafer sheet W is accommodated. The magazine 22 is formed in a shape of a prism in which a front surface and a rear surface are opened. The operator of the chip supplying apparatus 10 can open the opening/closing lid 20a of the housing 20 and replenish the wafer sheet W to the wafer sheet accommodation portion 28 by the rear surface of the magazine 22.

The magazine ascending/descending mechanism 24 includes a ball screw 30, and a motor 32 which rotates the ball screw 30. A nut (not illustrated) which is engaged with the ball screw 30 is fixed to the magazine 22. For this reason, when the ball screw 30 is rotated by the motor 32, the magazine 22 moves in the housing 20 in the up-and-down direction. By moving the magazine 22 in the up-and-down direction, it is possible to match the arbitrary wafer sheet accommodation portion 28 of the magazine 22 to the height of the conveying-out port 26 of the housing 20. According to this, it is possible to convey out the wafer sheet W to the wafer conveyance section 14 through the conveying-out port 26 from the wafer sheet accommodation portion 28.

The wafer conveyance section 14 is provided with a stage 34, a stage ascending/descending mechanism 36 which makes the stage 34 ascent and descend, a wafer table 38, and an operation head 40.

The stage ascending/descending mechanism 36 moves the stage 34 in the up-and-down direction. The stage ascending/descending mechanism 36 includes a ball screw 42 and a motor 44 which rotates the ball screw 42. A nut (not illustrated) which is engaged with the ball screw 42 is fixed to the stage 34. For this reason, when the ball screw 42 is rotated by the motor 44, the stage 34 moves in the up-and-down direction.

The wafer table 38 is supported to be slidable in the front-and-back direction with respect to the stage 34. The wafer table 38 can hold the wafer sheet. W which is conveyed out from the magazine 22. By driving an actuator (not illustrated), the wafer table 38 can move between a wafer sheet supplying position 38a which is positioned behind the wafer conveyance section 14, and a chip supplying position 38b which is positioned in front of the wafer conveyance section 14. In addition, the wafer table 38 can rotatably move around a vertical axis with respect to the stage 34. By driving a motor (not illustrated), the wafer table 38 can adjust an angle around the vertical axis with respect to the stage 34.

The operation head 40 is supported to be movable in the front-and-back direction and the right-and-left direction with respect to the stage 34. By driving an actuator (not illustrated), the operation head 40 moves in the front-and-back direction and in the right-and-left direction relative to the stage 34. The operation head 40 has a wafer drawing mechanism 46, a suction nozzle 48, and a camera 50 mounted thereon. The wafer drawing mechanism 46 draws out the wafer sheet W from the wafer sheet accommodation portion 28 of the magazine accommodation portion 12, and conveys the wafer sheet W to the wafer table 38 which is at the wafer sheet supplying position 38a. The suction nozzle 48 can suck a desired chip from the wafer sheet W in a state where the wafer table 38 is at the wafer sheet supplying position 38a. The camera 50 images the wafer sheet W which is held by the wafer table 38 from an upper surface in a state where the wafer table 38 is at the wafer sheet supplying position 38a. From the image which is imaged by the camera 50, it is possible to recognize a position and a posture of a chip which is a suction target of the suction nozzle 48 or a suction nozzle N which will be described later, and a state of the wafer table 38.

Above the chip supplying position 38*b* of the wafer table 38, an upper portion of the wafer conveyance section 14 is opened. For this reason, in a state where the wafer table 38 is at the chip supplying position 38*b*, it is possible to access the wafer sheet W which is held by the wafer table 38 from the mounting machine M. The mounting machine M is provided with a mounting head H. The mounting head H includes the suction nozzle N and a camera C. The suction nozzle N can suck the desired chip from the wafer sheet W in a state where the wafer table 38 is at the chip supplying position 38*b*. The suction nozzle N is operated based on the position and the posture of the chip which is recognized from the image imaged by the camera 50, but may be operated by recognizing the position and the posture of the chip from an image imaged by the camera C. The mounting head H can move in the front-and-back direction and in the right-and-left direction inside the mounting machine M, and can mount the chip which is sucked by the suction nozzle N on the substrate.

In addition, on the stage 34, a thrust mechanism which makes the chip easily picked from the dicing sheet by thrusting the wafer sheet W from a lower part of the wafer table 38 when the suction nozzle 48 of the wafer conveyance section 14 and the suction nozzle N of the mounting machine M suck the chip, a pod changer which switches a pod of the thrust mechanism, a nozzle changer which switches the suction nozzle 48, and the like, are mounted.

Figure 3:
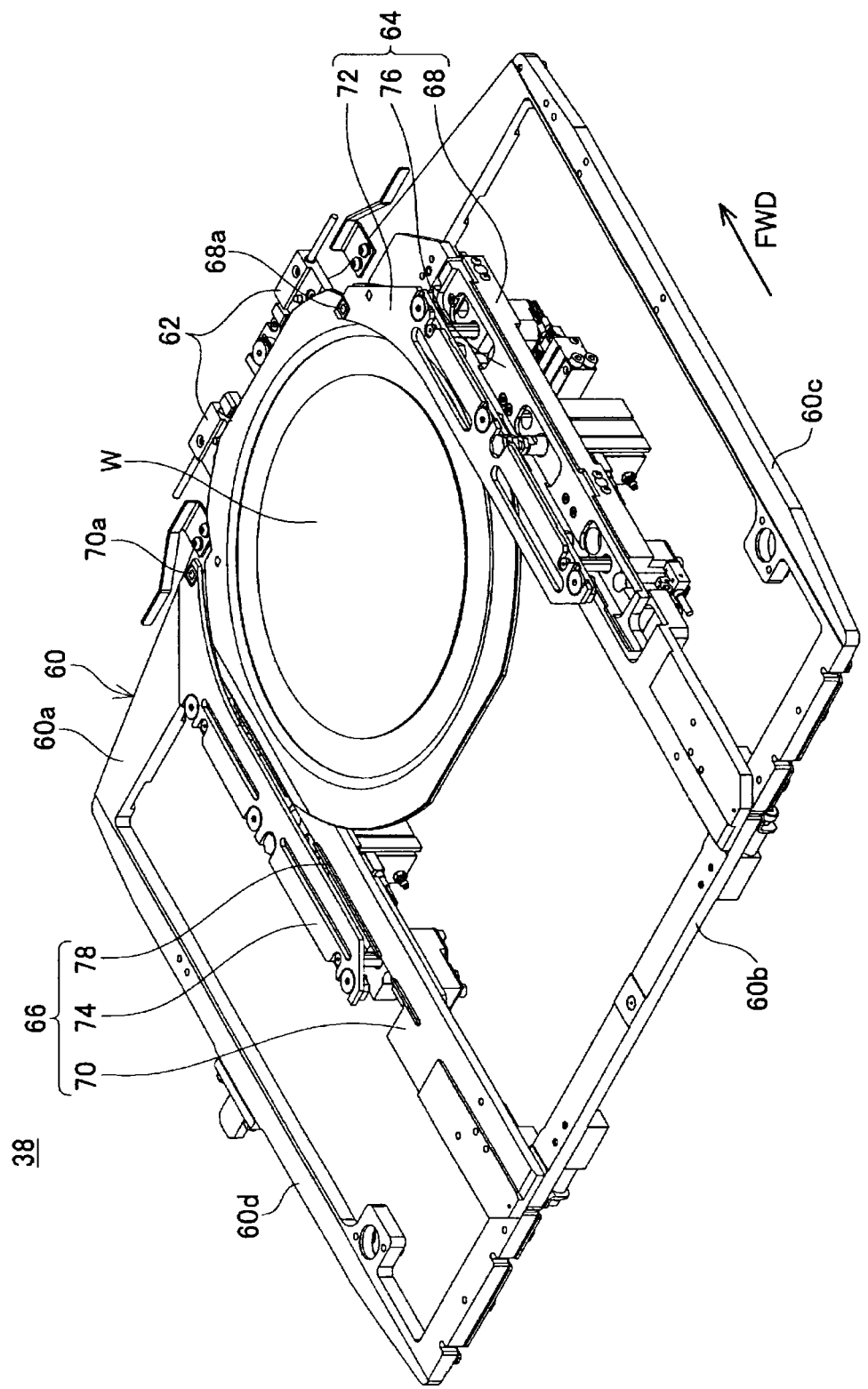
FIG. 3 is a view illustrating a state where a wafer table 38 holds a 6-inch wafer sheet W.
Figure 4:
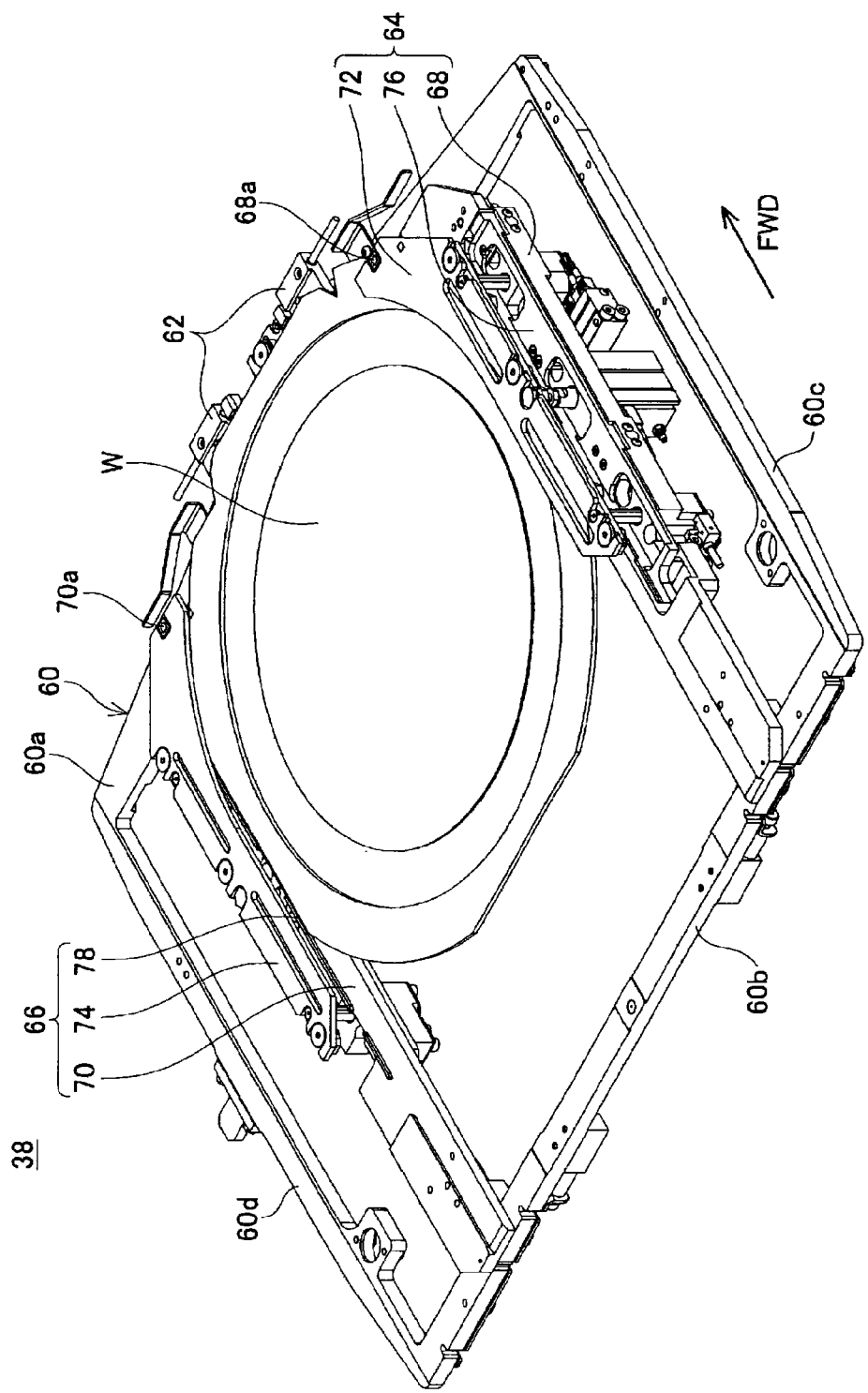
FIG. 4 is a view illustrating a state where the wafer table 38 holds an 8-inch wafer sheet W.
Figure 5:
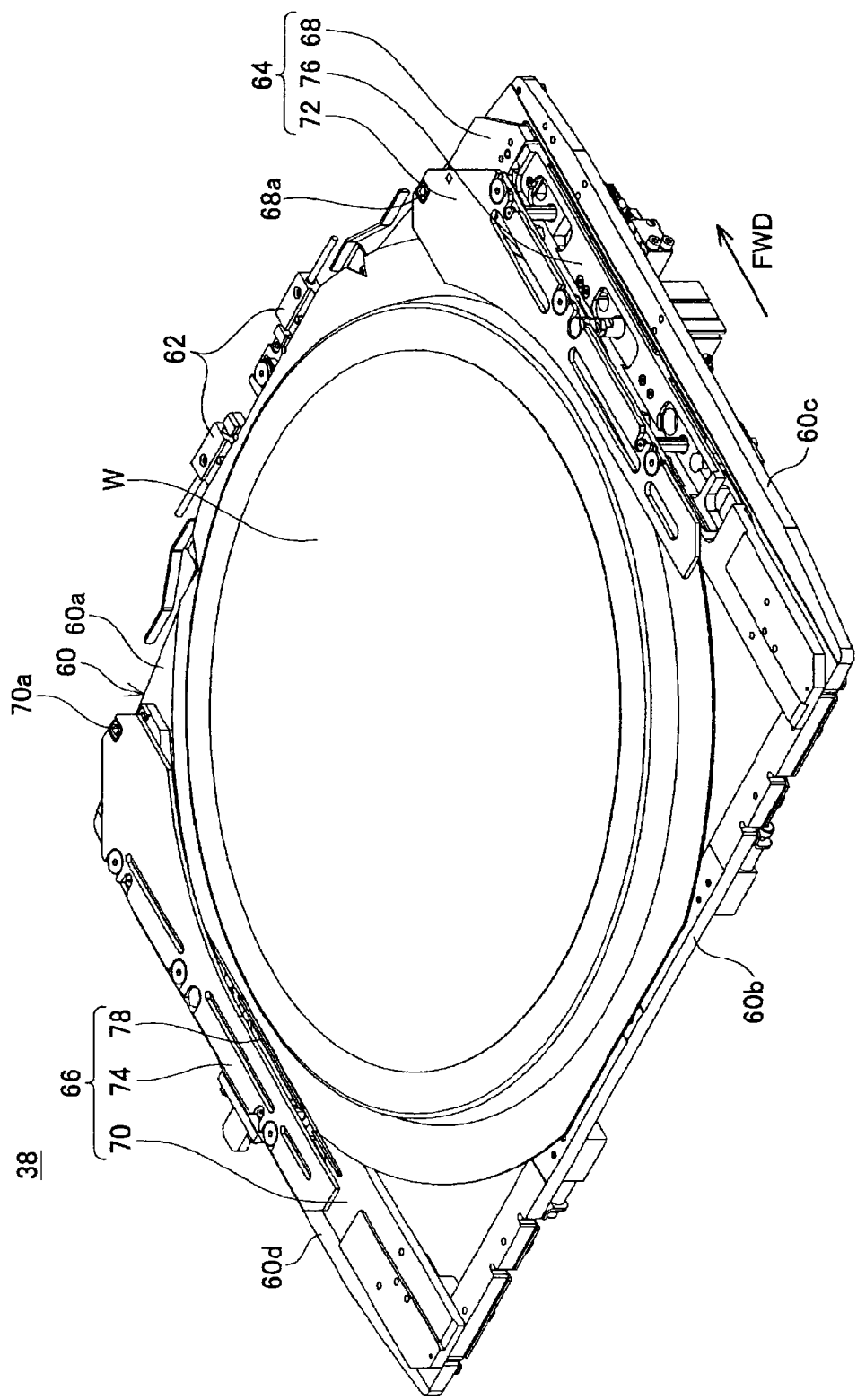
FIG. 5 is a view illustrating a state where the wafer table 38 holds a 12-inch wafer sheet W.

The wafer table 38 of the embodiment can hold wafer sheets having various sizes, such as 6 inches, 8 inches, or 12 inches. FIG. 3 illustrates a case where the wafer table 38 holds a 6-inch wafer sheet W. FIG. 4 illustrates a case where the wafer table 38 holds a 8-inch wafer sheet W. FIG. 5 illustrates a case where the wafer table 38 holds a 12-inch wafer sheet W.

As illustrated in FIGS. 3 to 5, the wafer table 38 is provided with a frame 60, a stopper 62, and a pair of clamp mechanisms 64 and 66.

The frame 60 is formed in a shape of a rectangular frame having an opening at the center thereof. The frame 60 is provided with a front frame plate 60*a*, a rear frame plate 60*b*, and a pair of side frame plates 60*c* and 60*d*. On an upper surface of a center portion of the front frame plate 60*a*, the stopper 62 is provided. As a front end of the wafer sheet W abuts against the stopper 62, the wafer sheet W is positioned in the front-and-back direction with respect to the wafer table 38.

The clamp mechanisms 64 and 66 are respectively provided with main plates 68 and 70, and sub-plates 72 and 74. In addition, one clamp mechanism 64 is provided with a side plate 76, and the other clamp mechanism 66 is provided with a side stopper 78.

The main plates 68 and 70 are supported to be across the opening of the frame 60 in the front-and-back direction by the front frame plate 60*a* and the rear frame plate 60*b*. On front sides of the main plates 68 and 70, the main plates 68 and 70 extend to be overlapped with an upper surface of the front frame plate 60*a*. On rear sides of the main plates 68 and 70, the main plates 68 and 70 extend to be overlapped with an upper surface of the rear frame plate 60*b*. The main plates 68 and 70 are supported to be slidable in the right-and-left direction with respect to the frame 60. The main plates 68 and 70 are locked with respect to the frame 60 at a position which is set in advance in accordance with the size of the held wafer sheet W. The wafer sheet W which is drawn out by the wafer drawing mechanism 46 is moved forward until the front end abuts against the stopper 62 in a state where both side ends are loaded on upper surfaces of the main plates 68 and 70.

The side stopper 78 is disposed between the main plate 70 and the sub-plate 74. The side stopper 78 is fixed to the main plate 70. The side stopper 78 guides forward movement of the wafer sheet W, and positions the side end of the wafer sheet W. The side plate 76 is disposed between the main plate 68 and the sub-plate 72. The side plate 76 is supported to be slidable in the right-and-left direction with respect to the main plate 68, and slides in the right-and-left direction as an air cylinder is driven. In the wafer table 38, when the wafer sheet W moves forward on the main plates 68 and 70, and the front end of the wafer sheet W abuts against the stopper 62, the side plate 76 is slid toward the side stopper 78. According to this, the wafer sheet W is held by the side stopper 78 and the side plate 76 from right and left sides, and the wafer sheet W is positioned in the right-and-left direction with respect to the wafer table 38.

The sub-plates 72 and 74 are supported to be movable in the up-and-down direction with respect to the main plates 68 and 70, and move in the up-and-down direction as the air cylinder is driven. In the wafer table 38, when the front end of the wafer sheet W abuts against the stopper 62, and further, when the wafer sheet W is held by the side stopper 78 and the side plate 76 from the right and left sides, the sub-plates 72 and 74 are moved toward the main plates 68 and 70. According to this, a side end portion of the wafer sheet W is held by the main plates 68 and 70, and the sub-plates 72 and 74 from upper and lower sides. According to this, the side end portion of the wafer sheet W is clamped, and the wafer sheet W is held by the wafer table 38.

In addition, on the upper surfaces of the main plates 68 and 70, identification marks 68*a* and 70*a* are provided. In the image which is imaged by the camera 50 of the wafer conveyance section 14 or by the camera C of the mounting machine M, it is possible to recognize the size of the wafer sheet W which can be held by the wafer table 38 by detecting positions of the identification marks 68*a* and 70*a*.

Figure 6:
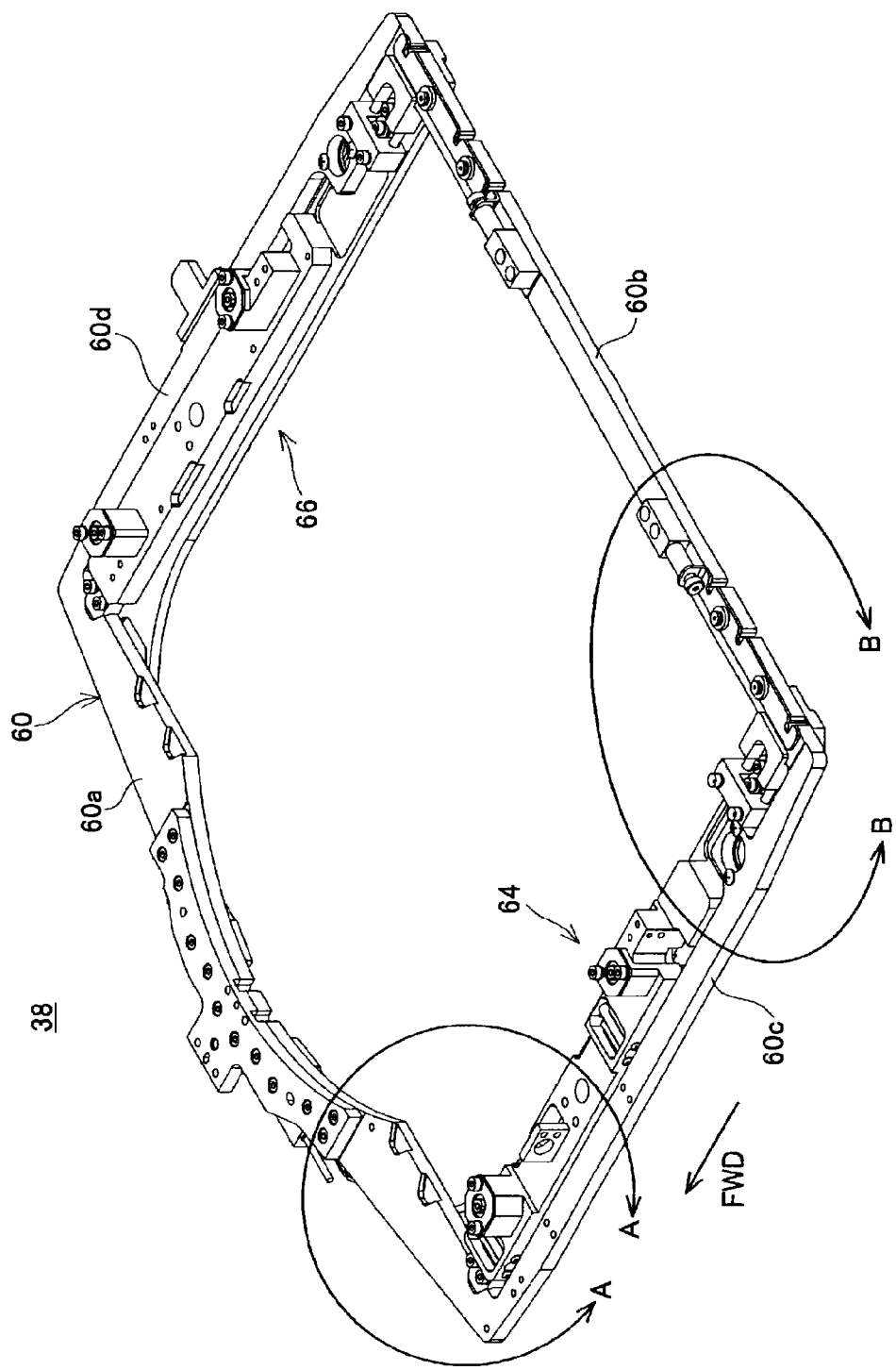
FIG. 6 is a view when the wafer table 38 is viewed from a lower surface side.

Hereinafter, with reference to FIGS. 6 to 8, size changing when the size of the wafer sheet W which is held by the wafer table 38 is changed, will be described with the clamp mechanism 64 as an example. The clamp mechanism 66 is also similar to the clamp mechanism 64. FIG. 6 is a view when the wafer table 38 is viewed from a lower surface side. In addition, FIG. 7 is an enlarged view along an A-A portion in FIG. 6, and FIG. 8 is an enlarged view along a B-B portion in FIG. 6.

Figure 7:
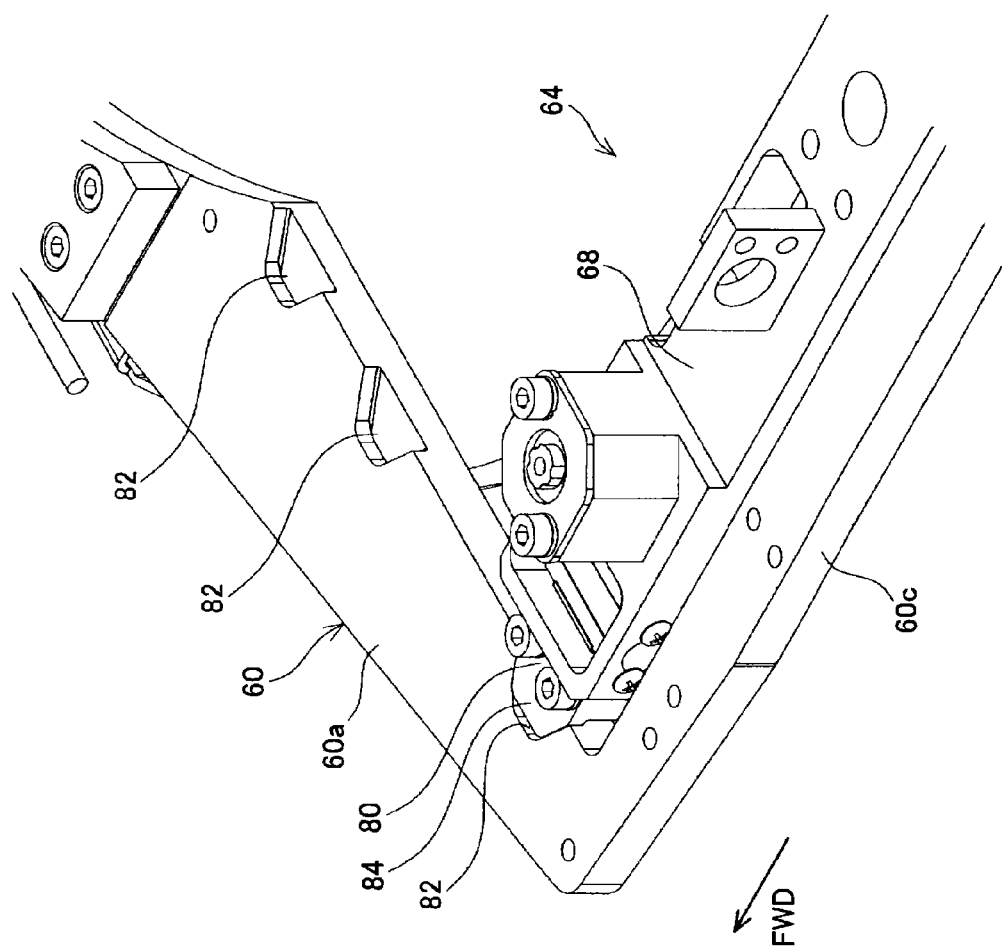
FIG. 7 is a detail enlarged view along A-A in FIG. 6.

As illustrated in FIG. 7, in front of the lower surface side of the main plate 68, a front block 80 which abuts against the rear surface of the front frame plate 60*a* is provided. The front block 80 is fixed to the main plate 68. In the front block 80, an engaging claw 84 which is engaged with an engaging groove 82 formed on the lower surface side of the front frame plate 60*a* is formed. The engaging claw 84 is formed in a trapezoidal shape in which the width narrows as approaching a tip end, and the engaging groove 82 is also formed in a trapezoidal shape in which the width narrows as approaching the inside. According to this, it is possible to easily perform engagement and disengagement of the engaging claw 84 and the engaging groove 82. When the engaging claw 84 is engaged with the engaging groove 82, the front side of the main plate 68 is prohibited from moving in the right-and-left direction with respect to the front frame plate 60*a*. As illustrated in FIG. 7, a plurality of engaging grooves 82 are formed at a position corresponding to the size of the wafer sheet W which is held by the wafer table 38.

Figure 8:
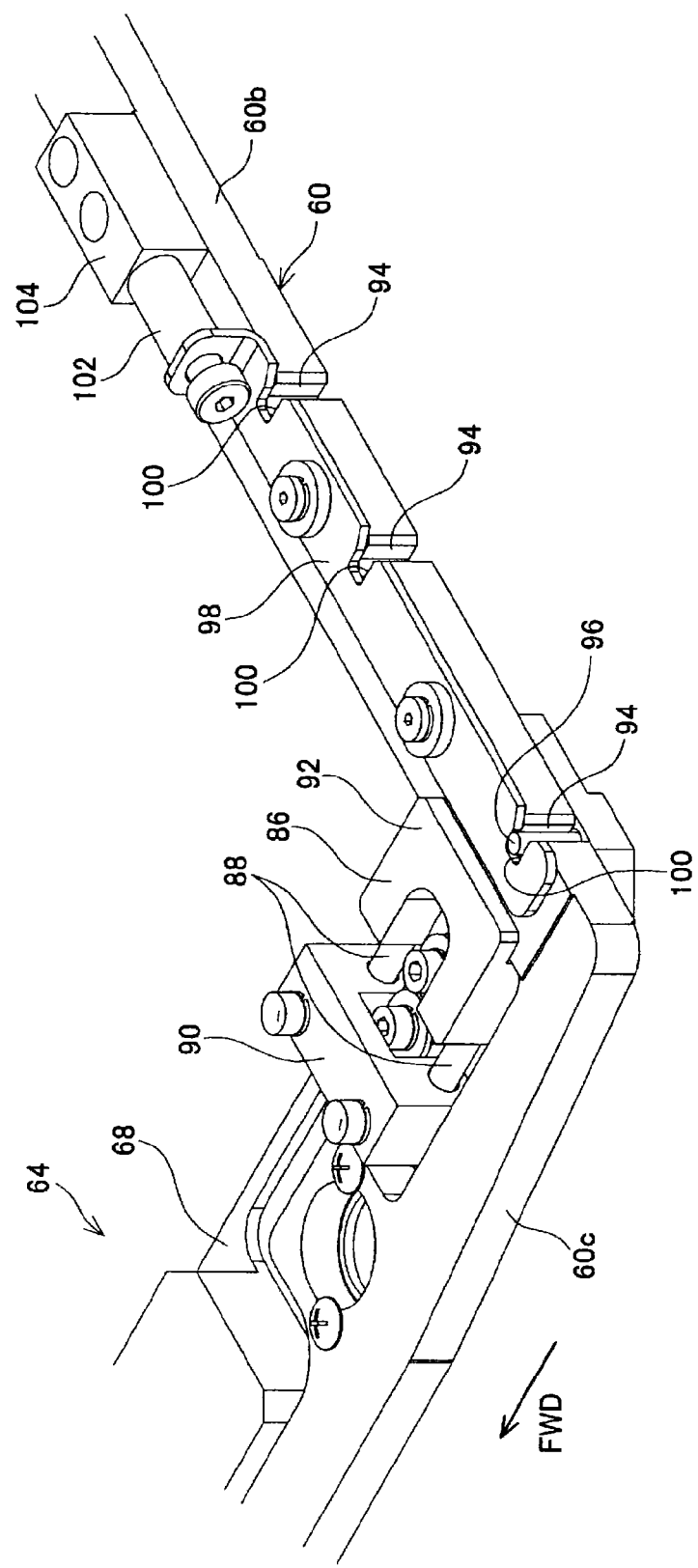
FIG. 8 is a detail enlarged view along B-B in FIG. 6.

As illustrated in FIG. 8, behind the lower surface side of the main plate 68, a rear block 86 which abuts against the front surface of the rear frame plate 60b, and an intermediate block 90 which is linked to the rear block 86 via a spring 88, are provided. The intermediate block 90 is fixed to the main plate 68 at a position between the front block 80 and the rear block 86. The rear block 86 is supported to be slidable in the front-and-back direction with respect to the main plate 68. In the rear block 86, a flange 92 which extends to be overlapped with the lower surface of the rear frame plate 60b is formed. In addition, a positioning pin 96 which is engaged with a positioning groove 94 formed on an outer side of the rear frame plate 60b is fixed to the rear end on the lower surface side of the main plate 68. As illustrated in FIG. 8, a plurality of positioning grooves 94 are formed at a position corresponding to the size of the wafer sheet W which is held by the wafer table 38. The position where the positioning groove 94 is formed on the rear frame plate 60b, and the position where the engaging groove 82 is formed on the front frame plate 60a, correspond to each other.

In a state where the clamp mechanism 64 is attached to the frame 60, the spring 88 is compressed, and an elastic restoring force in a direction in which the rear block 86 and the intermediate block 90 are separated from each other acts on the rear block 86 and the intermediate block 90. According to this, the rear block 86 is pressed against the front surface of the rear frame plate 60b, and the front block 80 is pressed against the rear surface of the front frame plate 60a. Accordingly, the engaging claw 84 is reliably engaged with the engaging groove 82, the positioning pin 96 is reliably engaged with the positioning groove 94, and the clamp mechanism 64 is locked with respect to the frame 60.

When the clamp mechanism 64 is slid in the right-and-left direction with respect to the frame 60, first, the operator grasps the main plate 68, and pulls down the main plate 68 rearward with respect to the frame 60. Accordingly, the spring 88 is compressed, the entire main plate 68 slides rearward, the engaging claw 84 of the front block 80 is detached from the engaging groove 82, and the positioning pin 96 is detached from the positioning groove 94. While maintaining this state, the operator slides the main plate 68 in the right-and-left direction with respect to the frame 60. When the main plate 68 is moved up to desired positions of the engaging groove 82 and the positioning groove 94, and the operator weakens a force of pulling down the main plate 68 rearward, by the elastic restoring force of the spring 88, the engaging claw 84 of the front block 80 is engaged with the engaging groove 82, and the positioning pin 96 is engaged with the positioning groove 94. According to this, it is possible to change in a stepwise manner the position of the clamp mechanism 64 in the right-and-left direction with respect to the frame 60.

In addition, on the lower surface side of the rear frame plate 60b, a rattling preventative plate 98 is provided. The rattling preventative plate 98 is supported to be slightly (specifically, within a range which is less than the width of the positioning groove 94) slidable in the right-and-left direction, with respect to the rear frame plate 60b. In the rattling preventative plate 98, a guide groove 100 which has substantially the same shape as that of the positioning groove 94 is formed. The rattling preventative plate 98 is connected to a block 104 which is fixed to the rear frame plate 60b via a spring 102. The spring 102 is attached in a state of being compressed, and biases the rattling preventative plate 98 toward the outer side in the right-and-left direction. When the positioning pin 96 is engaged with the positioning groove 94, the positioning pin 96 is pressed while abutting against the guide groove 100, and the rattling preventative plate 98 slides on an inner side in the right-and-left direction against the bias from the spring 102. In a state where the positioning pin 96 is engaged with the positioning groove 94, by the rattling preventative plate 98 which is biased by the spring 102, the positioning pin 96 is depressed toward the outer side in the right-and-left direction with respect to the positioning groove 94. According to this, the rattling of the positioning pin 96 in the positioning groove 94 is prevented.

As described above, according to the embodiment, without using a tool, the operator can change the position of the clamp mechanism in the right-and-left direction. An operation of changing the size of the wafer table 38 can be extremely easily performed.

According to the embodiment, regarding any size of the wafer sheet W, positioning is also performed by considering the center of the front end as a reference, with respect to the wafer table 38. Accordingly, it is possible to hold any size of the wafer sheet W at a position which is the nearest to the mounting machine M. It is possible to reduce a movement distance of the mounting head H of the mounting machine M.

In addition, by installing wafers having different sizes from each other onto a wafer holding board having the same tray shape as the wafer sheet W, without changing the size of the wafer table 38, a configuration in which the wafers having different sizes from each other are handled can be employed.

A representative and non-limiting specific example of the present disclosure is described in detail with reference to the drawings. The detail description simply illustrates the details for realizing a preferable example of the disclosure for those skilled in the art, and does not limit the range of the present disclosure. In addition, the disclosed additional characteristics can be used separately or together with other characteristics and inventions in order to provide a more improved chip supplying apparatus.

In addition, a combination of the characteristics or processes disclosed in the above-described detail description is not necessary when realizing the present disclosure in a broadest sense, and in particular, the description is only for describing the representative detail example of the present disclosure. Furthermore, various characteristics of the above-described representative detail example, and various characteristics described in the independent and dependent claims, are not necessarily combined according to the detail example described here or the listed order when providing an additional and useful embodiment of the present disclosure.

All of the characteristics described in this specification and/or claims, are characteristics which are disclosed separately and independently from each other as a restriction with respect to a certain item in the initial disclosure and the claims of the application, in addition to the configuration of the characteristics described in the embodiment and/or claims. Furthermore, the description regarding the entire numeral value range and group or aggregation is to disclose an intermediate configuration as a restriction with respect to a certain item in the initial disclosure and the claims of the application.

Above, detail examples of the present disclosure are described, but these are merely examples, and the range of the aspects of disclosure is not limited thereto. In the technology which is described within the range of the aspects of the disclosure, various modifications and changes of the above-described detail examples are included. Technical elements which are described in this specification and in the drawings achieve technical usefulness by using the examples independently or by combining various examples, and are not limited to the combination of the described aspects of the application. In addition, the technology described in this specification and in the drawings can achieve a plurality of purposes at the same time, and technical usefulness is realized only by achieving one of the purposes.

The invention claimed is:

1. A chip supplying apparatus which supplies a chip to a mounting machine which mounts the chip on a substrate, the chip supply apparatus comprising:
 a wafer table which holds a wafer sheet at a position where an operation head of the mounting machine can receive the chip, the wafer table including
  a frame including a front frame plate and a rear frame plate,
  a stopper which is fixed to a center of the front frame plate and configured to abut against a front end of the wafer sheet,
  a pair of clamp mechanisms which clamps both side ends of the wafer sheet and each of the pair of clamp mechanisms is supported by the front frame plate and the rear frame plate,
 wherein the pair of clamp mechanisms is configured to be moved in a right-and-left direction with respect to the frame.

2. The chip supplying apparatus according to claim 1,
wherein the frame includes a pair of side frame plates,
wherein a front engaging portion is formed in a vicinity of a front end of each of the pair of clamp mechanisms, and a rear engaging portion is formed in a vicinity of a rear end of each of the pair of clamp mechanisms,
wherein a plurality of front engaged portions, which are engaged with the front engaging portion, are formed on the front frame plate, and
wherein, at a position corresponding to a position of the front engaged portion, a plurality of rear engaged portions, which are engaged with the rear engaging portion, are formed on the rear frame plate.

3. The chip supplying apparatus according to claim 2,
wherein each of the pair of clamp mechanisms includes a main plate, a front block which abuts against a rear surface of the front frame plate, a rear block which abuts against a front surface of the rear frame plate, and an intermediate block which is disposed between the front block and the rear block and fixed to the main plate,
wherein one of the front block and the rear block is supported to be slidable in a front-and-back direction with respect to the main plate, and is connected to the intermediate block via an elastic body,
wherein the other one of the front block and the rear block is fixed to the main plate, and
wherein, by moving the main plate with respect to the frame in a direction in which the elastic body is compressed, an engagement between the front engaging portion and the front engaged portion, and the engagement between the rear engaging portion and the rear engaged portion, are released.

4. The chip supplying apparatus according to claim 3,
wherein, in at least one of the front engaged portion and the rear engaged portion, a rattling preventative plate, which is supported by the frame via the elastic body, is provided.

5. The chip supplying apparatus according to claim 3,
wherein, on an upper surface of the main plate, an identification mark is provided.

6. The chip supplying apparatus according to claim 1,
wherein a position of the pair of clamp mechanisms in the right-and-left direction with respect to the frame is changed in multiple steps.

* * * * *